United States Patent
Delp

(12) United States Patent (10) Patent No.: US 7,919,354 B2
Delp (45) Date of Patent: Apr. 5, 2011

(54) ASYMMETRIC ALIGNMENT OF SUBSTRATE INTERCONNECT TO SEMICONDUCTOR DIE

(75) Inventor: Gary S. Delp, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 470 days.

(21) Appl. No.: 12/139,185

(22) Filed: Jun. 13, 2008

(65) Prior Publication Data
US 2008/0248612 A1 Oct. 9, 2008

Related U.S. Application Data

(62) Division of application No. 11/260,334, filed on Oct. 27, 2005, now Pat. No. 7,405,476.

(51) Int. Cl.
*H01L 21/44* (2006.01)
*H01L 21/48* (2006.01)
*H01L 21/50* (2006.01)

(52) U.S. Cl. .................. 438/107; 438/128; 257/E21.499

(58) Field of Classification Search .................. 438/107, 438/108, 110, 128, 129; 257/E21.499
See application file for complete search history.

(56) References Cited

U.S. PATENT DOCUMENTS

| 6,531,782 | B1 | 3/2003 | Jones et al. | 257/773 |
| 6,908,314 | B2 | 6/2005 | Brown | 439/68 |
| 6,959,428 | B2 | 10/2005 | Broberg, III et al. | 716/18 |
| 2004/0113282 | A1 | 6/2004 | Hung | 257/778 |
| 2005/0073055 | A1 | 4/2005 | Pan et al. | 257/778 |
| 2007/0052091 | A1* | 3/2007 | Weekamp et al. | 257/724 |

OTHER PUBLICATIONS

Gary S. Delp, Patent Application entitled: "Composable System-in-Package Integrated Circuits and Process of Composing the Same", U.S. Appl. No. 11/079,028, filed Mar. 14, 2005, pp. 1-26.
Gary S. Delp, Patent Application entitled: "Base Platforms with Combined ASIC and FPGA Features and Process of Using Same", U.S. Appl. No. 11/079,439, filed Mar. 14, 2005, pp. 1-22.

* cited by examiner

*Primary Examiner* — Hoai V Pham
(74) *Attorney, Agent, or Firm* — David D. Brush; Westman, Champlin & Kelly, P.A.

(57) ABSTRACT

An apparatus includes a first semiconductor die and at least one further semiconductor die. A substrate is attached to the first die and the further die and has an electrical interconnect pattern that interconnects contacts on the first die with respective contacts on the further die. Features of the interconnect pattern have positions on the substrate with smaller tolerances relative to positions of the contacts on the first die than to positions of the contacts on the further die.

10 Claims, 4 Drawing Sheets

ASYMMETRIC ALIGNMENT OF SUBSTRATE INTERCONNECT TO SEMICONDUCTOR DIE

CROSS-REFERENCE TO RELATED APPLICATION

The present application is a divisional of and claims priority from U.S. patent application Ser. No. 11/260,334, filed Oct. 27, 2005, the content of which is hereby incorporated by reference in its entirety.

FIELD OF THE INVENTION

The present disclosure relates to integrated circuits, and more particularly to alignment of interconnect patterns on a substrate to which multiple semiconductor die are attached.

BACKGROUND OF THE INVENTION

Integrated circuits (ICs) are used in a wide range of electronic devices produced by a large number of manufactures. ICs are seldom manufactured (fabricated) by the system manufacturer, or the electronic device designer. Instead, ICs are manufactured by an IC foundry to the specifications of the electronic device designer and assembled by the system manufacturer.

Recently, a new type of integrated circuit system has been proposed, which is known as a composable system-in-package (SIP) in which a plurality of semiconductor die are attached to a substrate. For example, the substrate can support one or more user-configured "base platform" die and a plurality of standard product die, referred to as peripheral die or "sidecars".

Examples of composable SIPs are described in greater detail in U.S. application Ser. No. 11/079,028, filed Mar. 14, 2005, and entitled "COMPOSABLE SYSTEM-IN-PACKAGE INTEGRATED CIRCUITS AND PROCESS OF COMPOSING THE SAME" and U.S. application Ser. No. 11/079,439, filed Mar. 14, 2005, and entitled "BASE PLATFORMS WITH COMBINED ASIC AND FPGA FEATURES AND PROCESS OF USING SAME," and assigned to the same Assignee as the present application.

The interconnect pattern on the substrate provides signal and power interconnections between the various die that are attached to the substrate and to external devices. The electrical connections to the die are typically made to contact pads on the surfaces of the die that are attached to the substrate.

When composing an SIP, the available technologies have limitations in pitch and interconnection densities. One of the major factors driving a wider pitch of interconnect between the several die in the package is the precision at which the die can be placed relative to each other on the substrate. The substrate must make connections from the base die to one or more of the peripheral die. Connections can also made from each die to the boundaries of the package.

The contact pads on each die define the points on the die to which the electrical interconnections are fabricated on the substrate. However when the die are attached to the substrate, they can be attached with an accuracy that is $\pm X$, $\pm Y$ and $\pm \theta$, where X and Y represent distance along orthogonal X and Y axes relative to some origin and $\theta$ represents orientation or rotation about the origin. When the interconnect pattern is built up in the substrate, the features of the interconnect need to accommodate the variance of die placement and thus, contact pad location. Otherwise, the interconnect pattern will fail to make the necessary interconnections. Placement accuracy can therefore dictate the pad size and pitch on the die and resulting interconnect densities.

With existing approaches, the pad size and pitch dimensions are the same for all of the die in an SIP. The features of the substrate interconnect pattern are defined within a frame of reference that spreads the placement error over all of the die and the substrate. This drives a fixed contact pitch to all of the die in the SIP.

An improved alignment structure and method of manufacturing interconnects in integrated circuit systems are therefore desired, which allow for finer pitch and interconnect densities.

The present invention provides solutions to these and other problems and offers other advantages over the prior art.

SUMMARY OF THE INVENTION

One embodiment of the present invention is directed to an apparatus having a first semiconductor die and at least one further semiconductor die. A substrate is attached to the first die and the further die and has an electrical interconnect pattern that interconnects contacts on the first die with respective contacts on the further die. Features of the interconnect pattern have positions on the substrate with smaller tolerances relative to positions of the contacts on the first die than to positions of the contacts on the further die.

Another embodiment of the present invention is directed to an apparatus, which includes a first semiconductor die having electrical contacts with a first diameter along a direction of die placement variation, and at least one further semiconductor die having electrical contacts with a second, larger diameter along the direction of die placement variation. A substrate is attached to the first die and the further die, wherein at least one of the die has a placement variation on the substrate. The substrate has an electrical interconnect pattern between the contacts on the first die and the further die with feature positions along the direction of die placement variation that are referenced to a position of the first die to a greater extent than to positions of the further die.

Another embodiment of the present invention is directed to a method, which includes attaching a first semiconductor die and at least one further semiconductor die to a substrate. The first die and the further die have electrical contacts. After the die are attached to the substrate an interconnect pattern is fabricated on the substrate, which interconnects the contacts on the first die with the contacts on the further die. The interconnect pattern has feature positions that are referenced to a position of the first die to a greater extent than to a corresponding position of the further die.

DETAILED DESCRIPTION OF ILLUSTRATIVE EMBODIMENTS

Embodiments of the present invention are described in the context of a composable system-in-package (SIP). However, embodiments of the present invention are equally applicable to other types of integrated circuit systems in which two or more semiconductor die are attached to a substrate. Embodiments are particularly useful in systems in which the interconnect pattern is built up on the substrate after the die are attached to the substrate. According to one embodiment, the interconnect pattern has features that are referenced to one or more reference points on a subset of the die, such as the base die, such that these die can be manufactured with contact pads having smaller dimensions and pitch than those of the other die on the substrate.

Figure 1:
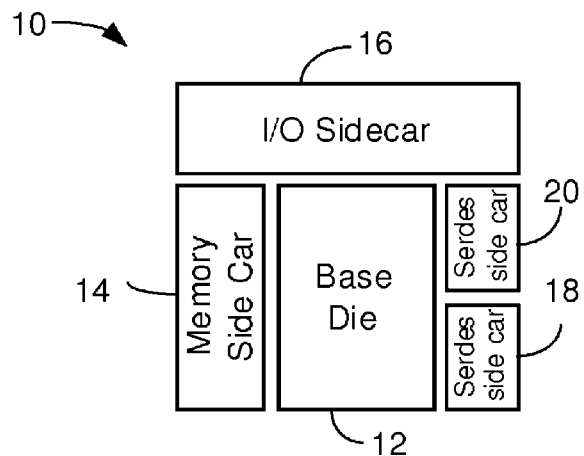
FIG. 1 is a top plan view of a composable system-in-package having a plurality of semiconductor die, according to one embodiment of the present invention.

FIG. 1 is a top plan view of a composable SIP 10 having a plurality of semiconductor die 12, 14, 16, 18 and 20. Die 12, 14, 16, 18 and 20 are attached to a common substrate 22 (shown in FIGS. 3 and 4). In this example, die 12 is a base die and die 14, 16, 18 and 20 are peripheral die that support various functions of the base die. The peripheral die can also be referred to as "sidecars". For example, SIP 10 can include a memory "sidecar" 14, and input-output (I/O) "sidecar" 16, and serializer-deserializer (SERDES) "sidecars" 18 and 20. Other types of peripheral die can be used in alternative embodiments, such as FPGA transistor fabric.

The base die can implement any individual or combination of standard, semi-custom or fully custom ASIC or FPGA features, for example. In one embodiment, base die 12 is a user-configured base platform, such as one of the Rapid Chip® slices available from LSI Logic Corporation of Milpitas, Calif. In addition, base die 12 can include the base platforms disclosed in U.S. application Ser. Nos. 11/079,028 and 11/079,43910, filed March 14. In these patent applications, the term "base platform" refers to a platform yet to be configured into a functional IC by metallization layers, custom logic and memory in the transistor fabric, custom circuit portions in defined regions and program fabric for configurable logic blocks (for FPGAs, for example). The term "configured platform" refers to a functional device formed from a base platform and the included metallization layers.

As described in the above-applications, and contrary to typical base platforms, the base die can be designed without many hard macro ("hardmac") functions required by the completed circuit, namely standard input/output modules, high-speed serializer/deserializer interconnects (SERDES), standard processors, FPGA program fabrics, large memories, matrix RAMs (such as described in U.S. Pat. No. 6,804,811 for "Process for Layout of Memory Matrices in Integrated Circuits" by Andreev et al., and the like. Instead, standard die are attached to substrate 10 to perform the functions of standard and custom circuit elements, such as large memories 14, including matrix RAM, I/O 16, and SERDES 18 and 20. The standard die can be selected from a library of die provided by the IC foundry or are die that perform custom functions of the device designer that can be economically configured in a die.

The standard circuit modules, such as memory, processors, matrix RAM, I/O modules and discrete circuits are embodied in separate standard die, which, when coupled to a configured platform according to the present invention, form an integrated circuit system in a package (SIPs). This allows the base platforms to have more flexibility in design and more applicability to a wider set of applications. With fewer base platforms in each family, costs of base platform generation and support is reduced. The IC foundry will need to supply tools to support the base platforms of the present invention to enable users, such as device designers, to design SIPs, including selection of standard die, but overall the number and support of tools is reduced due to the reduced number of base platforms. Preferably, the platforms, and in some cases the die, are designed with over-provisioning of transistor fabric and other functions to permit new functions to be added to future versions of a die or configured platform, or expansion of existing functions, without significant timing and placement issues.

However, any type or group of semiconductor die can be attached to the substrate to form an SIP in alternative embodiments the present invention.

In the example shown in FIG. 1, electrical connections must be made from the base die 12 to each of the peripheral die 14, 16, 18 and 20.

Figure 2:
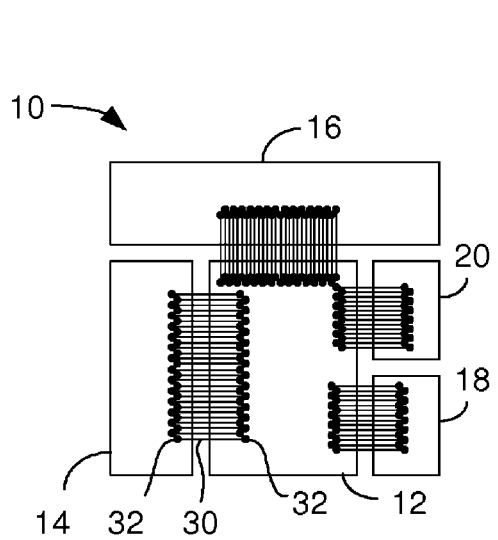
FIG. 2 is a top plan view of the SIP shown in FIG. 1, which schematically illustrates electrical interconnections between the various die.

FIG. 2 is a top plan view of SIP 10, which schematically illustrates electrical interconnections 30 between die 12, 14, 16, 18 and 20. These electrical interconnections include signal and power interconnections, which are made by conductive traces through the substrate (shown in FIGS. 3 and 4) to which each of the die are attached. The conductive traces electrically interconnect one or more contacts 32 on one die with respective contacts 32 on one or more other die. The electrical contacts on the die are known as "capture pads". The capture pads are the points on the die to which the conductive traces on the substrate make electrical contact.

In an actual system, the interconnect pattern of the substrate would be more complex and would typically include conductive segments in multiple layers connected through one or more vias. Connections are also made from each of the die to the boundaries of the package (not shown), but the tolerances of these connections are significantly greater than those of the inter-chip interconnections, so these interconnections are considered further in this example.

Figure 3:
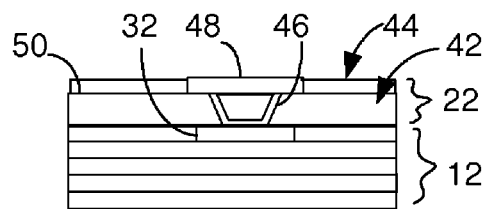
FIG. 3 is a simplified, cross-sectional view of a base die attached to a substrate within the SIP.

FIG. 3 is a simplified, cross-sectional view of base die 12 attached to substrate 22. Base die 12 includes a plurality of layers, such as diffused semiconductor layers and one or more metal interconnect "routing" layers. The diffused semiconductor layers form a transistor fabric that is interconnected by conductive segments defined in the metal routing layers. The base die is built up from the diffused layers, through the metal routing layers, to the level of metal that instantiates the capture pads 32. Each routing layer is separated by a suitable dielectric. For simplicity, only one capture pad 32 is shown in FIG. 3. Capture pads 32 can be arranged in any suitable pattern on the die, such as at orthogonal lattice points or in a hexagonal pattern. In a further process step, the capture pad layer can be covered with a polyamide passivation layer (not shown) in order to protect the capture pads from electrical and oxide exposure from the time of die manufacture to the time at which the die is attached to substrate 22.

In the simplified example shown in FIG. 3, substrate 22 includes a layer 42 of insulating material, such as polyamide, and a metal routing layer 44. Substrate 22 can be flexible or rigid. A conductive via 46 extends through insulating layer 42, from a cover pad 48 to the respective capture pad 32. Cover pad 48 is electrically coupled to one or more conductive segments 50 in layer 44 (and/or in any additional routing layers). The bottom of each via 46 provides a point of electrical contact from a respective trace on substrate 22 to a respective capture pad 32 on die 12.

Figure 4:
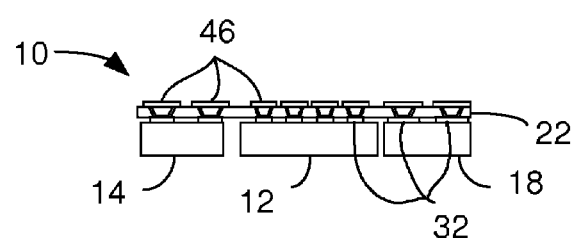
FIG. 4 is a side view of the SIP, which schematically illustrates die attached to the substrate.

FIG. 4 is a side view of SIP 10, which schematically illustrates die 12, 14 and 18 attached to substrate 22. Again for simplicity, only a few pads 32 and vias 46 are shown for each die, and substrate 22 is illustrated with only one routing layer. However in a typical embodiment, each die would include many more contacts, and substrate 22 would include multiple conductive layers with vias between the various layers.

When SIP is assembled, the die can be connected to the substrate or the substrate can be connected to the die, and the step of "attaching" the die to the substrate as described herein can reflect either process. In one embodiment, the die are attached directly to the substrate. In another embodiment, the die can be attached first to a temporary or permanent carrier, which dimensionally stabilizes the positions of the die relative to one another before being attached to the substrate.

In one embodiment, the manufactured die are attached a blank substrate having no electrical interconnections. Once the die are mounted to the blank substrate, the interconnect pattern is built up on the substrate. First, the lowest layer of vias (such as vias 46 in FIGS. 3 and 4) are cut through the substrate. The vias are filled or plated with conductive material and the conductive segments and the cover pads are produced over the vias with subsequent layers of, for example, titanium clad copper alternating with polyamide. This build up forms the interconnections between the various die in the system, and there are several processes by which the built up can be produced in alternative embodiments of the present invention.

When the die are attached to the substrate, they are attached with an accuracy of ±X, ±Y and ±θ, where ±X represents a position variance or tolerance along an X axis, ±Y represents a position variance along a Y axis and ±θ represents a variance in rotation or orientation about a reference point. When the interconnect pattern is built up in substrate 22, the features of the interconnect pattern need to accommodate the variance in placement of the die.

Figure 5:
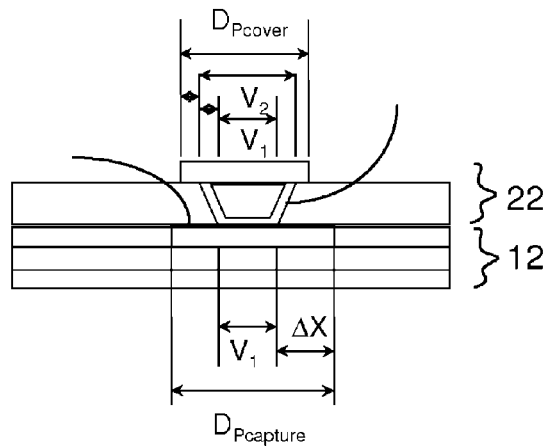
FIG. 5 illustrates a relationship between placement variance and required feature size for a base die in the SIP.

FIG. 5 illustrates the relationship between placement variance and required feature size. Table 1 provides a definition of the dimension symbols shown in FIG. 5.

TABLE 1

| Symbol | Meaning |
| --- | --- |
| $D_{Pcapture}$ | Diameter of Capture Pad |
| $D_{Pcover}$ | Diameter of Cover Pad |
| $V_1$ | Via bottom contact diameter |
| $V_2$ | Via top cover size (due to sidewall slope) |
| ΔX | Placement variance |

In FIG. 5, diameter of the capture pads 32 are sized at $D_{Pcapture}=V_1+2\Delta X$ so that the via bottom will make contact with the respective capture pad, even if the location of the via bottom varies from a desired position by ΔX in any direction. The pad pitch (center-to-center spacing between the capture pads) would be $D_{Pcapture}+Space_{Die}$, where $Space_{Die}$ is the distance between the edge of one capture pad to the nearest edge of an adjacent capture pad.

Thus, the placement tolerance ΔX, and similarly ΔY and Δθ, can drive the dimensions of pad size, pad pitch, via size, etc. If the value of ΔX is calculated from a centroid of error such that the error is shared over all the die evenly, then this value of ΔX would drive a fixed pad size, via size and pitch to all of the die in the SIP. The placement error can be shared over all the die if the features of the interconnect pattern are built up on the substrate using common reference points on the substrate and/or reference points on the plurality of die.

However, a common pad size and pitch may limit the number of interconnections that can be made to the base die, for example, or may require a greater area to implement.

In one embodiment of the present invention, the placement tolerance, and thus the require pad size and pitch, are applied asymmetrically to one or more of the die on the substrate. This allows some of the die to be place more accurately relative to the substrate interconnections and therefore have a finer pitch and density of interconnections than other die on the substrate.

According to one embodiment, the interconnect pattern has features that are built up using one or more reference points or origins on a subset of the die, such as on the base die. Since the interconnect features are built using these die as a reference, relative placement is much more accurate and the die can be manufactured with contact pads having smaller dimensions and pitch than those of the other die on the substrate.

For example with LSI Logic's RapidChip® CSIP, all of the peripheral die in the SIP can be implemented as standard products. The base die can be implemented as a user configurable base platform or a semi-custom or fully-custom ASIC, for example. In this case, it is possible to refine the design of the standard products to tolerate a wider contact pad size and pitch. If this is done, and if the interconnect is aligned not to the applied substrate, but to a reference point or origin on the base die, then the dimensions and pitch of the capture pads on the base die can be finer than those on the standard product die. The standard product die would therefore use a more coarse set of design rules, requiring more area and/or more design overhead to avoid growing the die footprint, but the expense is amortized over a larger use base of the generic standard products.

If the location of the base die is used as the frame of reference for positioning and building the interconnect pattern on the substrate, the minimum capture pad size on the base die would be $V_{1B}+2Ic_{Tolerance}$, where $V_{1B}$ is the diameter of the via bottom on the base die and $Ic_{Tolerance}$ is the tolerance of the interconnect writing tool. The value of $Ic_{Tolerance}$ is typically much less than a typical placement tolerance, ΔX. This moves the placement tolerance of the base die to the peripheral die, such that the capture pads on the peripheral die can have a size, $D_{PcaptureP}=V_1+2Ic_{Tolerance}+4\Delta X$. Looking at FIG. 5, the dimension, ΔX, is replaced with 2ΔX for the peripheral die, and is removed for the base die.

Figure 6:
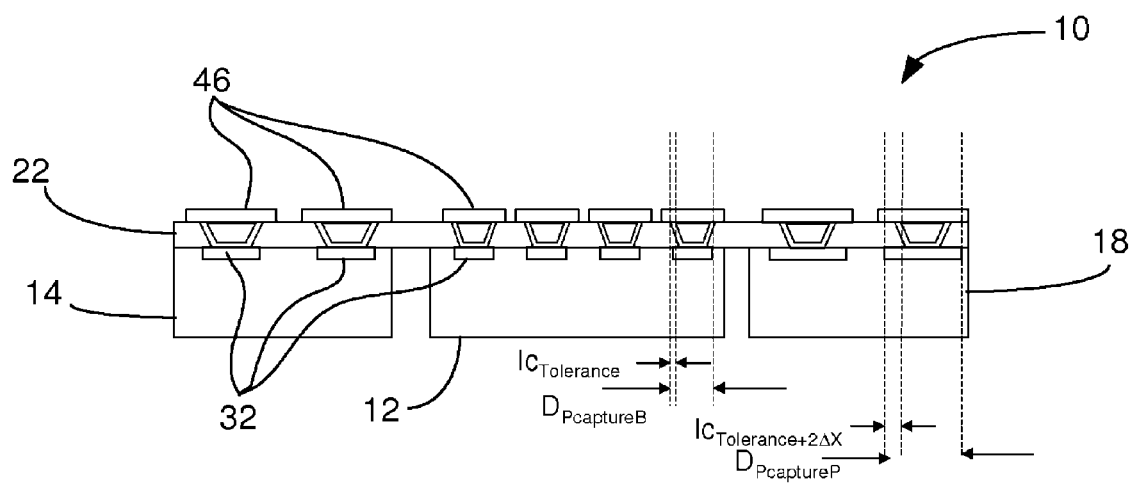
FIG. 6 is a schematic, side view of an SIP having a base die with a smaller capture pad size and a finer pad pitch than the peripheral die.

FIG. 6 is a schematic, side view of SIP 10 having a base die 12 with a smaller capture pad size and a finer pad pitch than the peripheral die 14 and 18. FIG. 6 is similar to FIG. 4, but is enlarged to illustrate asymmetric tolerances. The capture pads 32 on base die 12 have a size, $D_{PcaptureB}=V_{1B}+2Ic_{Tolerance}$. These pads need to accommodate only a +/−variance of $Ic_{Tolerance}$ on either side of the ideal via position. In contrast, the capture pads 32 on peripheral die 14 and 18 have a size, $D_{PcaptureP}=V_{1B}+2Ic_{Tolerance}+4\Delta X$, which needs to accommodate the via placement variance $Ic_{Tolerance}$ and the die placement variance 2ΔX on either side of the ideal via position.

Figure 7A:
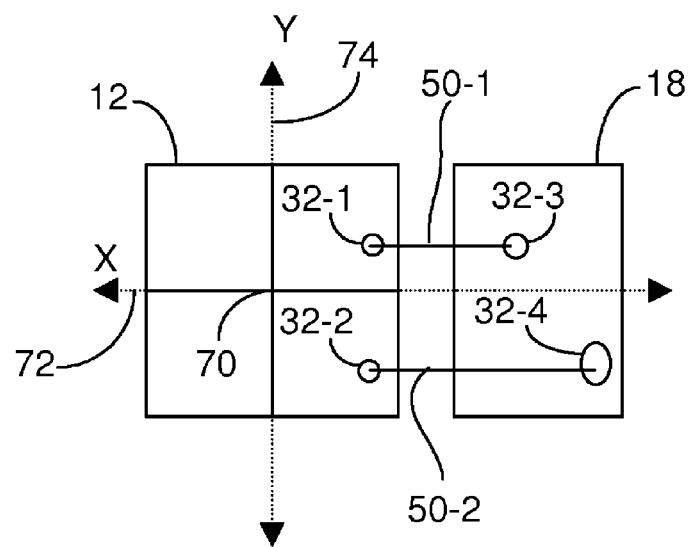
FIGS. 7A and 7B illustrate variance in pad size based on the potential for rotational variance of the base die relative to the peripheral die.
Figure 7B:
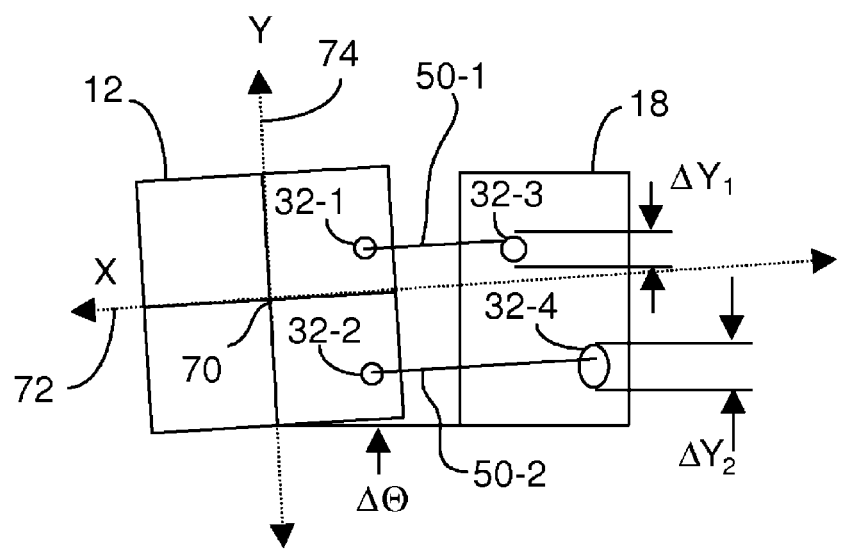

FIGS. 7A and 7B illustrate a refinement of the approach based on the potential of rotational variance of base die 12 relative to peripheral die 18. In FIG. 7A, there is no rotational variance in the placements of die 12 and 14 about an origin 70 on base die 12. Origin 70 can have any location, such as at the center of the base die, and can define the origin of X and Y axes 72 and 74. Base die has capture pads 32-1 and 32-2, which are connected to capture pads 32-3 and 32-4 on die 18 through interconnects 50-1 and 50-2, respectively, on the substrate (not shown).

In this example, capture pads 32-1 and 32-2 have a smaller diameter than capture pads 32-3 and 32-4. In addition, capture pad 32-4, which is further from origin 70 than capture pad 32-3, has a larger diameter than capture pad 32-3. This allows for a greater tolerance for X and/or Y displacement due to rotational variation for capture pads having a greater radial distance from origin 70, such as capture pad 32-4. In an alternative embodiment, capture pad 32-3 can be the same size as capture pads 32-1 and 32-1, with capture pad 32-4 being larger.

As shown in FIG. 7B, base die 12 has a rotational placement variation of $\Delta\theta$ relative to die 18. However since the interconnect pattern of the substrate is built up using one or more reference points or origins on base die 12, exclusive of any reference points or origins on peripheral die 18, the interconnects 50-1 and 50-2 remain aligned with the centers of capture pads 32-1 and 32-2 on die 12. In contrast, the end points of interconnects 50-1 and 50-2 (as represented by the locations of the respective via bottoms) are displaced upwards along the Y-axis. If the capture pad (and/or via) dimensions are sized to accommodate this displacement, the interconnects can still make their necessary connections to the capture pads.

The capture pads can have any desired shape, such as circular or oval, and can have different dimensions in length and width, for example. Since capture pad 32-4 is located at a greater radial distance from origin 70 than capture pad 32-3, capture pad 32-4 can be sized with a greater diameter along the Y-axis than capture pad 32-3 to allow for the greater Y-displacement of the interconnect pattern at greater radial distances. In this example, capture pad 32-3 has a diameter $\Delta Y_1$ along the Y-axis, and capture pad 32-4 has a diameter $\Delta Y_2$ along the Y-axis, where $\Delta Y_2 > \Delta Y_1$. Similar variances can be used to accommodate rotational displacement along the X-axis.

In the embodiment shown in FIG. 7B, the fine pitch timing critical signals on die 18 can be placed on the inside (the side closer to base die 12) and the coarser signals, and the I/O driver and other out-of-package connections can be placed on the outside of the die (the side further from base die 12).

In one embodiment, the capture pads on each die are the same size as other capture pads on the same die, but the capture pads on an individual die can be sized according to the relative distance of that die to the base die. In other words, die that are placed further from the base die could have larger capture pads.

Figure 8:
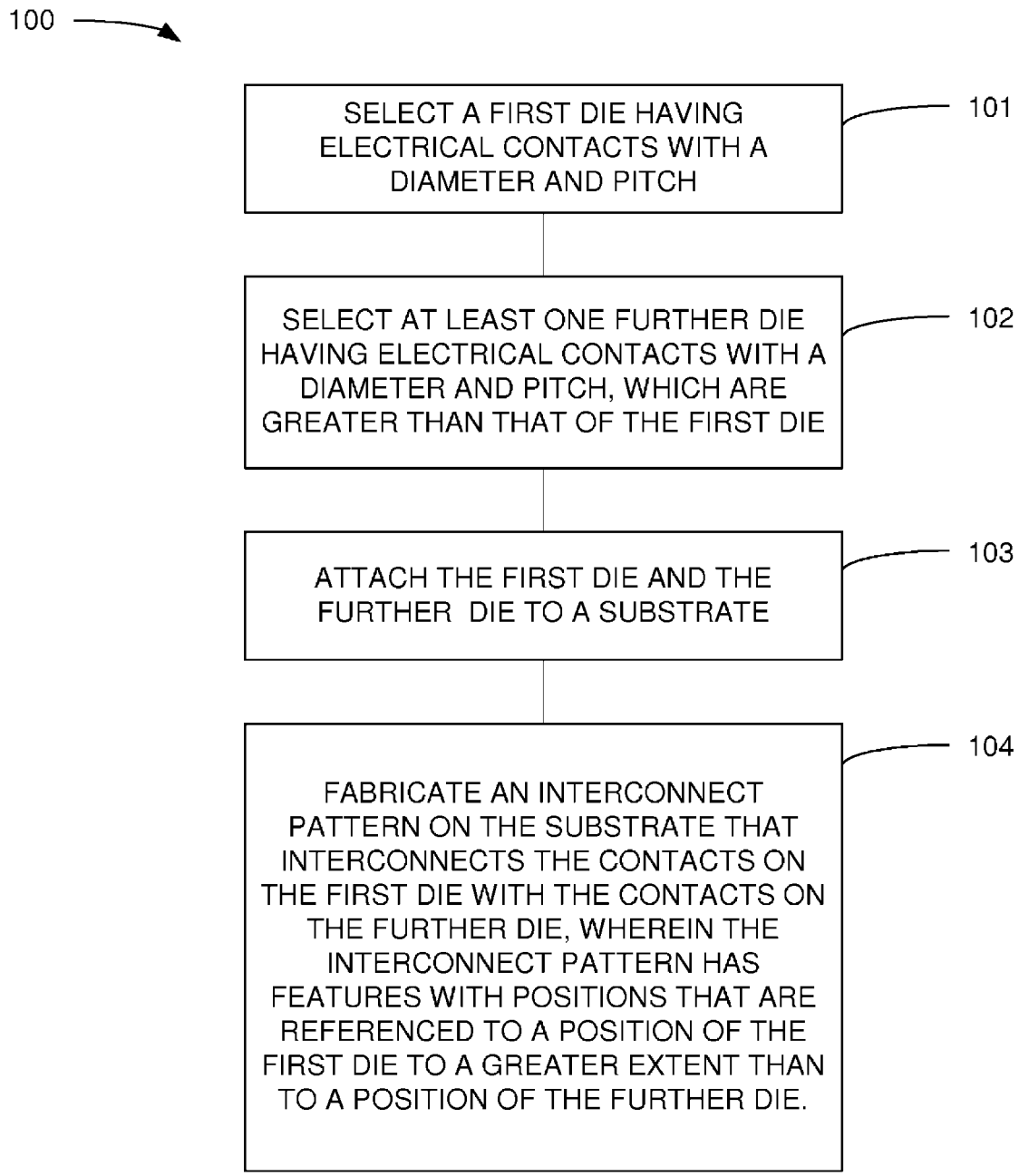
FIG. 8 is a flow chart illustrating a process of fabricating an SIP according to one embodiment of the present invention.

FIG. 8 is a flow chart illustrating a process 100 of fabricating an SIP according to one embodiment of the present invention. In step 101, a first die, such as a base die, is selected. The first die has electrical contacts with a diameter and a pitch. At step 102, at least one further die are selected, such as the peripheral die shown in FIG. 1. The further die have electrical contacts with diameters and pitch that are greater than that of the first die.

At step 103, the first die and the further die are attached to a substrate. After step 103, an interconnect pattern is fabricated on the substrate that interconnects the contacts on the first die with the contacts on the further die, at step 104. The interconnect pattern has features with positions that are referenced to a position of the first die to a greater extent than to positions of the further die.

For example in one embodiment, these interconnect pattern features can include the positions of the vias that make the electrical connections to the capture pads on the various die. The via positions can be referenced to reference positions on the base die to a greater extent than, and even exclusive, of any reference positions on the peripheral die. For example, the interconnect pattern features can be referenced primarily (or exclusively) to the base die along one or both of the X and Y axes and/or to relative rotation of the base die.

Greater placement tolerance can be achieved on the peripheral die by several methods. In one method, the capture pad diameter and the via diameter can be increased in at least one direction for one or more of the peripheral die, relative to the base die. In another method, the capture pad size can be increased for one or more of the peripheral die, while leaving the via size on the substrate the same for all die. In another method, the via sizes on the substrate can be increased for one or more of the peripheral die, relative to the via sizes for the base die, while leaving the capture pad sizes the same for all die. These method allow for greater placement tolerance for the peripheral die, but increase the pad pitch for the peripheral die.

With the above-methods and apparatus, a composable system-in-package can be assembled in which the base die uses a finer pitch of interconnect design rules (e.g., pad pitch, via pitch, pad size, and/or via size) that allow for a finer clustering of interconnection features through the substrate. The peripheral die use a coarser set of interconnect design rules, which require more area and/or more design overhead to avoid increasing the footprint of the die. However, the expense represented by the increased area or increased design overhead is amortized over a larger use base, particularly if the peripheral die are implemented as standard products.

A finer pitch of interconnections to the base die allows for many more interconnections to and from the base die, which is typically at the center of the SIP. The vast majority of connections on the substrate pass through the base die, so making the pitch finer in the most congested part of the substrate means that the overall SIP can be made smaller. This means that the SIP can be made faster less expensively and can be made to consume less power.

Also, the finer pitch makes the base die interconnections simpler. Since in one embodiment, the base die is generally used in just one design, making the processing of design patterns for the SIP and the base die simpler minimizes unique design investment.

The above-methods and apparatus produce advantageous asymmetries of interconnect requirements, where the peripheral die have coarser pitch requirements. In addition, the minimum required contact pad size can be based in part on its radial distance from the placement rotation centroid. Power and ground pins are carefully interleaved with pins to provide the necessary power and ground planes throughout the design.

Although the present invention has been described with reference to preferred embodiments, workers skilled in the art will recognize that changes may be made in form and detail without departing from the scope of the invention.

What is claimed is:

1. A method comprising:
   a) attaching a first semiconductor die and at least one further semiconductor die to a substrate, wherein the first die and the further die comprise electrical contacts; and
   b) fabricating an interconnect pattern on the substrate that interconnects the contacts on the first die with the contacts on the further die, wherein the interconnect pattern has feature positions that have smaller placement error relative to the first die than to the further die.

2. The method of claim 1 wherein step b) comprises fabricating the interconnect pattern such that the feature positions have smaller tolerances relative to positions of the contacts on the first die than to positions of the contacts on the further die, along a direction of die placement variance.

3. The method of claim 1 wherein the contacts on the first die have a first dimension along a direction of die placement variance, and the contacts on the further die have a second dimension along the direction of die placement variation, which is larger than the first dimension.

4. The method of claim 1 wherein, in step a), the first semiconductor die comprises a base platform having at least one user-defined metallization layer coupling a diffused transistor fabric of the platform to perform one or more functions, wherein the contacts of the first die provide external electrical connections to circuit elements within the base platform; and the further die comprise at least one standard integrated circuit product, wherein the contacts of the further die provide external electrical connection to circuit elements within the further die.

5. The method of claim 1, wherein step b) is performed after performing step a).

6. The method of claim 1, wherein step b) comprises fabricating the interconnect pattern with the feature positions of the interconnect pattern positioned along at least one of an X axis and an orthogonal Y axis relative to a position of the first die, exclusive of positions of the further die and the substrate.

7. The method of claim 1, wherein step b) comprises fabricating the interconnect pattern with a rotational orientation positioned relative to an origin on first die, exclusive of any origins on the further die and on the substrate.

8. The method of claim 1 wherein:

the contacts on the first die to which the substrate interconnect pattern connects have a first pitch on the first die along a direction of placement variation of the further die; and the contacts on the further die to which the substrate interconnect pattern connects have a second pitch on the further die along the direction of placement variation, which is larger than the first pitch.

9. The method of claim 1, wherein step b) comprises fabricating the interconnect pattern with the features of the interconnect pattern having positions on the substrate that are positioned relative to an origin on the first die, and wherein:

the contacts on the further die comprise a first set of contacts and a second set of contacts, which are radially further from the origin on the first die than the first set of contacts; and the second set of contacts have a larger diameter along at least one dimension than the first set of contacts.

10. A method comprising:

a) attaching a first semiconductor die and at least one further semiconductor die to a substrate, wherein the first die and the further die comprise electrical contacts; and b) after step a), fabricating an interconnect pattern on the substrate that interconnects the contacts on the first die with the contacts on the further die, wherein the interconnect pattern has feature positions that have smaller placement error relative to the first die than to the further die such that the feature positions of the interconnect pattern have smaller placement error relative to positions of the contacts on the first die than to positions of the contacts on the further die.

* * * * *